US007833895B2

(12) United States Patent
Bonifield et al.

(10) Patent No.: US 7,833,895 B2
(45) Date of Patent: Nov. 16, 2010

(54) TSVS HAVING CHEMICALLY EXPOSED TSV TIPS FOR INTEGRATED CIRCUIT DEVICES

(75) Inventors: Thomas D. Bonifield, Dallas, TX (US); Brian E. Goodlin, Plano, TX (US); Mona M. Eissa, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/463,282

(22) Filed: May 8, 2009

(65) Prior Publication Data

US 2009/0278238 A1    Nov. 12, 2009

Related U.S. Application Data

(60) Provisional application No. 61/052,487, filed on May 12, 2008.

(51) Int. Cl.
    *H01L 21/44* (2006.01)
(52) U.S. Cl. .................. 438/598; 438/454; 257/621; 257/E21.237; 257/E21.499; 257/E21.597; 257/E21.705; 257/E23.004; 257/E23.008; 257/E23.011
(58) Field of Classification Search .............. 257/621, 257/E21.237, 499, 597, 705, E23.004, E23.008, 257/E23.011; 438/598
    See application file for complete search history.

(56) References Cited

U.S. PATENT DOCUMENTS

| 6,498,381 | B2 * | 12/2002 | Halahan et al. ............ 257/449 |
| 6,916,725 | B2 * | 7/2005 | Yamaguchi .................. 438/459 |
| 7,034,401 | B2 * | 4/2006 | Savastiouk et al. .......... 257/778 |
| 7,049,170 | B2 * | 5/2006 | Savastiouk et al. .......... 438/106 |
| 7,060,601 | B2 * | 6/2006 | Savastiouk et al. .......... 438/584 |
| 7,176,128 | B2 * | 2/2007 | Ahrens et al. ............... 438/643 |
| 7,186,586 | B2 * | 3/2007 | Savastiouk et al. .......... 438/108 |
| 7,241,641 | B2 * | 7/2007 | Savastiouk et al. .......... 438/106 |
| 7,241,675 | B2 * | 7/2007 | Savastiouk et al. .......... 438/597 |
| 7,491,582 | B2 * | 2/2009 | Yokoyama et al. .......... 438/109 |
| 7,498,661 | B2 * | 3/2009 | Matsuo ....................... 257/621 |
| 7,741,152 | B2 * | 6/2010 | Huang et al. ................ 438/109 |
| 2002/0084513 | A1 * | 7/2002 | Siniaguine .................. 257/621 |
| 2005/0133930 | A1 * | 6/2005 | Savastisuk et al. .......... 257/774 |
| 2005/0136634 | A1 * | 6/2005 | Savastiouk et al. .......... 438/597 |
| 2005/0136635 | A1 * | 6/2005 | Savastiouk et al. .......... 438/597 |
| 2005/0189636 | A1 * | 9/2005 | Savastiouk et al. .......... 257/678 |

(Continued)

*Primary Examiner*—Thao X Le
*Assistant Examiner*—Eric W Jones
(74) *Attorney, Agent, or Firm*—Yingsheng Tung; Wade J. Brady, III; Frederick J. Telecky, Jr.

(57) ABSTRACT

A method for fabricating ICs including via-first through substrate vias (TSVs) and ICs and electronic assemblies therefrom. A substrate having a substrate thickness including a top semiconductor surface and a bottom surface is provided including at least one embedded TSV including a dielectric liner and an electrically conductive filler material formed on the dielectric liner. A portion of the bottom surface of the substrate is mechanically removed to approach but not reach the embedded TSV tip. A protective substrate layer having a protective layer thickness remains over the tip of the embedded TSV after the mechanical removing. Chemical etching exclusive of mechanical etching for removing the protective substrate layer is used form an integral TSV tip that has an exposed tip portion that generally protrudes from the bottom surface of the substrate. The chemical etching is generally a three step chemical etch.

8 Claims, 6 Drawing Sheets

U.S. PATENT DOCUMENTS

| | | | |
|---|---|---|---|
| 2005/0212127 A1* | 9/2005 | Savastiouk et al. | 257/734 |
| 2006/0035416 A1* | 2/2006 | Savastiouk et al. | 438/125 |
| 2006/0040423 A1* | 2/2006 | Savastibuk et al. | 438/106 |
| 2006/0076661 A1* | 4/2006 | Savastiouk et al. | 257/678 |
| 2008/0318361 A1 | 12/2008 | Han et al. | |
| 2009/0166846 A1* | 7/2009 | Pratt et al. | 257/698 |
| 2009/0191708 A1* | 7/2009 | Kropewnicki et al. | 438/667 |
| 2009/0224371 A1* | 9/2009 | Yu et al. | 257/621 |
| 2009/0243046 A1* | 10/2009 | Shi et al. | 257/621 |

* cited by examiner

US 7,833,895 B2

TSVS HAVING CHEMICALLY EXPOSED TSV TIPS FOR INTEGRATED CIRCUIT DEVICES

CROSS REFERENCE TO RELATED APPLICATIONS

This application claims the benefit of Provisional Application Ser. No. 61/052,487 entitled "ETCH METHOD FOR PREPARING THE TIPS OF THROUGH-SILICON-VIAS TO ENABLE DIE OR WAFER LEVEL ATTACH TO ANOTHER DIE OR WAFER", filed May 12, 2008, which is herein incorporated by reference in its entirety.

FIELD OF THE INVENTION

Embodiments of the present invention relate to integrated circuits (IC) devices having through substrate vias.

BACKGROUND

As known in the art, through-substrate vias (referred to herein as TSVs), which are commonly referred to as through-silicon vias, are vertical electrical connections that extend from one of the electrically conductive levels formed on the top surface of a wafer or IC die (e.g., contact level or one of the metal interconnect levels) to the backside (bottom) surface. As a result, the TSV comprising device can be bonded face-up and utilize vertical electrical paths to couple to other IC devices (e.g., on a die, wafer) or to mount to a package substrate. The vertical electrical paths are significantly shortened relative to conventional wire bonding technology, generally leading to significantly faster device operation.

Regarding fabrication of TSVs, in a typical via-first process, vias are formed to a depth (e.g., 100 to 200 µm) that is significantly less than the full wafer thickness (e.g., 300 to 800 µm) using chemical etching, laser drilling, or one of several energetic methods, such as Reactive Ion Etching (RIE). Once the vias are formed, they are generally framed with a dielectric liner to provide electrical isolation from the surrounding substrate, and then made electrically conductive by filling the vias with an electrically conductive filler material (e.g., copper, tungsten, or doped polysilicon) to form embedded TSVs. The bottom of the embedded TSV is generally referred to as an embedded TSV tip. Since most electrically conductive filler materials are metals that can degrade minority carrier lifetimes (e.g., copper or tungsten), a barrier layer is generally deposited on the dielectric liner. In the case of an electroplated metal (e.g., copper) process, a seed layer is generally added after the barrier layer.

A backgrinding step is then conventionally used to thin the wafer by removing a sufficient thickness of the substrate (e.g., 50 to 300 µm) from the bottom surface of the wafer to reach the embedded TSV tip to expose the electrically conductive filler material at the distal end of the TSV tip. The high substrate removal rate provided by the backgrinding process is needed for manufacturability of the thinning process due to the large substrate thickness (e.g., several hundred µms) being removed. A subsequent polish step, (e.g. chemical mechanical polish (CMP)) can be used to remove on the order of several µms from the bottom surface of the substrate in an attempt to reduce the mechanical damage and contamination generated by the backgrinding process. Alternatively or additionally, a wet or dry chemical etch can be used to reduce the mechanical damage and the contamination resulting from the backgrinding.

The distal end of the completed TSV tip is conventionally flush with the bottom surface of the substrate. A solder bump or other electrically conductive finish may be added to the TSV tip prior to assembly to a workpiece which protrudes outward a relatively short distance from bottom surface of the substrate.

SUMMARY

The Present Inventors have recognized that for a conventional via-first TSV process, the TSV tips get damaged, scratched and/or cracked since the last portion of the backgrind process grinds the TSV tips. Even with a conventional CMP and/or a chemical etch step following backgrinding, damage, scratching and/or cracking generally still remains in the dielectric liner, the diffusion barrier metal (if present) and the electrically conductive filler material of the TSVs. As a result of such residual damage, scratching, cracking and the resulting leakage paths, the separation distance between the exposed electrical conductive filler material of the TSV tip and the substrate (e.g., Si) can be too small to prevent significant electrical leakage between the TSV and the surrounding substrate (i.e. when the TSV and the substrate are tied to different voltage levels). Such leakage can be at a high enough level to significantly reduce IC performance and/or circuit yield, particularly for certain RF devices (e.g., RF power amplifier), and can also lead to degraded reliability of the IC.

Moreover, the Present Inventors have recognized that conventional backgrinding into the TSV tips smears the electrically conductive filler material (e.g., metal) onto the back surface of the substrate. Such contamination can significantly reduce minority carrier lifetimes in the active circuitry.

The Present Inventors have discovered by modifying the conventional backgrinding process so that the backgrinding process only provides a portion of the wafer thinning, with chemically etching provided the final portion of the wafer thinning, damage, scratching or cracking damage to the dielectric liner, the diffusion barrier metal (if present) and the electrically conductive filler material of the TSV can be significantly reduced or eliminated. As a result, electrical isolation between the TSVs and the substrate can be significantly improved by embodiments of the invention.

Backgrinding, according to embodiments of the invention, thus approaches but does not reach the embedded TSV tips and accordingly leaves a residual protective substrate layer portion, thus avoiding direct physical contact of the TSV tip with the abrasive surface of the backgrinding tool. As described above, avoiding direct physical contact of the TSV tip with the backgrind tool has been found by the Present Inventors to avoid, or at least significantly reduce, mechanical damage to the electrically conductive filler material, diffusion barrier metal (if present) and dielectric liner surrounding the TSV, as well as reduce or eliminate smearing of the electrically conductive filler material (e.g., metal) on the bottom substrate surface. As defined herein, a "chemical etch" refers to a wet or dry (e.g., plasma) etch that is exclusive of mechanical etching. A "chemical etch exclusive of mechanical etching" as used herein can include CMP provided the CMP process is configured to function as a chemical etch by providing a selectivity between the material of the wafer (e.g., silicon) and the dielectric liner of >10:1, and thus have at most a minimal mechanical component. For example, a CMP process having no abrasive particles (e.g., no particles having a Mohs hardness≧the Mohs hardness of silica) can in certain arrangements provide a minimal mechanical component.

Embodiments of the invention generally comprise backgrinding for partial substrate thinning to leave a protective substrate layer to retain the embedded TSV tip, followed by a sequence of chemical etches for removing the protective substrate layer and a portion of the dielectric liner to expose the electrically conductive filler material of the TSV tip. Integral TSV tips are formed that generally protrude from the bottom surface of the substrate, and are referred to herein as protruding integral TSV tips. Leaving a protective substrate portion after backgrinding has been found generally to significantly improve electrical isolation and thus reduce leakage between TSV tip and the surrounding substrate.

DETAILED DESCRIPTION

Figure 1A:
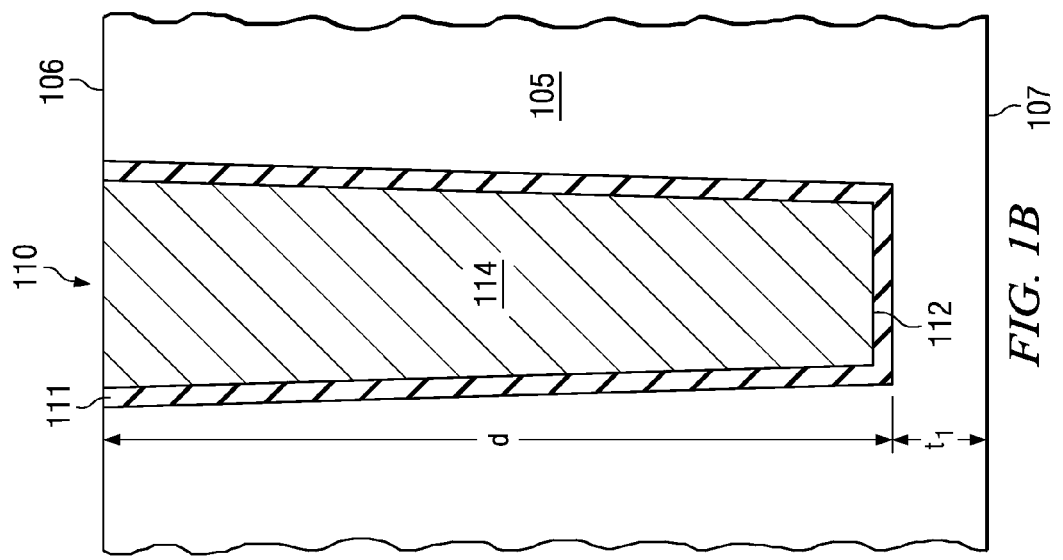
FIG. 1A-E shows a series of cross sectional depictions of a substrate wafer following various steps in an exemplary method for fabricating ICs including via-first TSVs having protruding integral TSV tips, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Spatially relative terms, such as "beneath," "below," "lower," "above," "upper," and the like may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Embodiments of the invention describe methods for fabricating ICs and ICs therefrom including via-first TSVs that generally include protruding integral TSV tips that reduce leakage between TSV tips and the surrounding substrate. Leakage is reduced by avoiding or at least significantly reducing mechanical damage to the dielectric liner, the diffusion barrier metal (if present) and the electrically conductive filler material, which has been found by the Present Inventors to improve electrical isolation between the TSVs and the substrate. FIG. 1A-E show a series of cross sectional depictions of a substrate wafer following various steps in an exemplary method for fabricating ICs including via-first TSVs having protruding integral TSV tips, according to an embodiment of the invention.

FIG. 1A shows a cross sectional depiction of a substrate 105 having a substrate thickness (t) comprising a top semiconductor surface 106 and a bottom surface 107 opposite the top semiconductor surface 106 including at least one embedded TSV 110 having an embedded TSV tip 112 formed in the substrate 105. Substrate 105 is generally referred to herein as wafer 105. Although wafer 105 is generally described herein as being a bulk silicon wafer, wafer 105 can be an epitaxial wafer, a semiconductor on insulator (SOI) wafer, or a wafer based on a material other than silicon.

The substrate thickness (t) is generally 300 to 800 µm. The embedded TSV 110 extends from the top semiconductor surface 106 to an embedded TSV depth (d) that is less than the thickness (t) of the substrate 105. The range of the TSV depth (d) is generally <2% within a wafer 105 with average depth of <2% variation from wafer to wafer in a production lot of wafers. The effect of the variation of the TSV depth (d) on the final total variation of height of the TSV tips can be reduced by measuring the TSV depth (d) of each wafer 105 and using the known depth in calculating a target value for the subsequent backgrind amount for that wafer. For example, the TSV depth (d) can be 10 to 200 µm, thus generally being at least 100 µm to nearly 800 µm less than the thickness (t) of the substrate 105.

The embedded TSV 110 shown includes a dielectric liner 111 and an electrically conductive filler material 114 formed on (i.e. within) the dielectric liner 111. The dielectric liner 111 should generally be thick enough to provide electrical isolation for the device formed on wafer 105 and the package design. This thickness of dielectric liner 111 can generally range from 0.1 to 10 µm, with a typical thickness of 0.5 to 2 µm. The dielectric liner 111 should generally not have pinholes or cracks unless the subsequent packaging process provides an additional dielectric which can cover such pinholes or cracks.

In some embodiments of the invention the electrically conductive filler material 114 comprises a metal such as Cu or W or a degeneratively doped semiconductor (n+ or p+ polysilicon). Dielectric liner 111 can comprise a variety of dielectrics, such as silicon oxide (e.g., $SiO_2$), silicon oxynitride, silicon nitride ($Si_3N_4$), silicon oxynitride, or polymers, such as a polyimide. A barrier layer which is generally present when electrically conductive filler material 114 comprises a metal and a seed layer which is generally present when electrically conductive filler material 114 comprises an electroplated metal such as copper, are both not shown for simplicity.

Figure 1B:
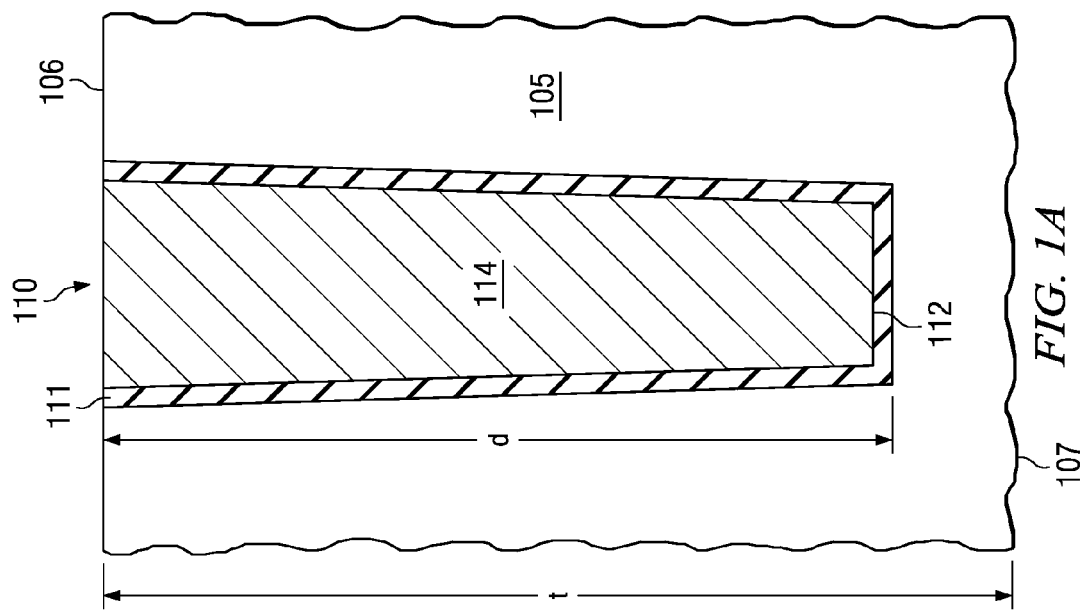

FIG. 1B is a cross sectional depiction of the resulting structure following mechanical removing (e.g., backgrinding sometimes followed by a polish step) a portion of the bottom surface 107 of the substrate 105 to approach but not reach the embedded TSV tip 112. A protective substrate layer having a protective layer thickness (shown as $t_1$) remains over the embedded TSV tip 112 after the mechanical removing.

The polish process functions to remove substantially all the surface roughness and substrate damage that generally results from the backgrinding. The protective layer thickness ($t_1$)

following mechanical removing is generally 1 μm to 50 μm. In one embodiment, the protective layer thickness ($t_1$) is from 2 μm to 10 μm.

The protective substrate layer provides several significant helpful functions. Since the TSV tips do not directly experience grinding, the TSV tips do not generally receive any significant damage, scratching and/or cracking due to conventional backgrinding into the TSV tips. As described above, even with a conventional CMP and/or a chemical etch step following backgrinding, damage, scratching and/or cracking generally still remains in the dielectric liner, the diffusion barrier metal (if present) and the electrically conductive filler material of the TSVs. Another function of the protective substrate layer is to avoid contamination of the bottom surface of the substrate resulting from conventional via-first TSV processes that as described above due to grinding into the TSV tips smear the electrically conductive filler material (e.g., metal) on the bottom surface of the substrate. As a result of the protective substrate layer, the backside of the substrate for embodiments of the invention generally have less than $1\times10^{12}$ atoms of the electrically conductive filler material per $cm^2$ on it surface, because the electrically conductive filler material and other electrical conductors (e.g., metals, if present) of the TSVs are not smeared onto the substrate surface by grinding.

In a typical embodiment, as known in the art, the top semiconductor (e.g., silicon) surface 106 of the wafer 105 is bonded using a suitable adhesive to a wafer carrier (both not shown) before backgrinding. If an adhesive is used, the range of the thickness of the adhesive for attaching the carrier to the wafer 105 should generally be <4% within a wafer with average thickness variation of <4% from wafer to wafer. The adhesive thickness can generally be between 10 and 300 μm.

The carrier can generally be any suitable carrier, such as a Si wafer carrier, a glass carrier, or a backgrind tape with adequate thermal and chemical compatibility with respect to the subsequent process steps. The carrier thickness should generally range <0.3% within a wafer with average carrier thickness range of <5% variation from carrier to carrier. The effect of the variation of the carrier thickness on the final total variation of the TSV tips can generally be reduced by measuring the carrier thickness that is used for each wafer 105 and using the known thickness in calculating a target value for the subsequent backgrind amount for that wafer. The carrier thickness can generally be between 50 and 1000 μm.

The range of the thickness of the bonded carrier and wafer 105 after backgrind should generally be <2 μm within a bonded carrier and wafer with average thickness variation of <2 μm from bonded carrier and wafer to bonded carrier and wafer. The bonded carrier and wafer thickness after backgrind can generally be between 200 and 1200 μm. As described above, after backgrind the TSV tips remain embedded in the substrate and thus are not exposed as would be the case in a conventional backgrind process to form via-first TSVs. The thickness of the protective substrate layer ($t_1$) over the embedded TSV tips 110 is generally between 2 μm and 30 μm. Thicker values for the protective layer ($t_1$) can still generally be used with embodiments of the invention, but may lead to higher fabrication cost for the subsequent etch steps.

Because the backgrinding process generally grinds to reach a predetermined final thickness, the protective substrate layer thickness ($t_1$) remaining after backgrinding/polishing can be controlled by knowing the thickness of the carrier and the thickness of the adhesive, as well as the depth (d) of the embedded TSV 110. The final thickness target of the carrier and wafer 105 pair after backgrind can be targeted to reduce the final range of variation of the height of TSV tips and the exposed portion of the final TSV tips by measuring the results of the several process steps which contribute to the combined variation of the exposed TSV tips as described below.

The last step of the mechanical removing is generally a polish step. The polish step generally only removes about 2 μm of the thickness from the bottom surface 107 of the substrate 105.

The mechanical removing process should generally provide a polished bottom surface 107 of the substrate 105 with a surface roughness of <2 μm, and is typically <0.1 μm. If the surface roughness is larger than about 2 μm, then the individual TSV tips will generally have too much variation caused by the roughness; some TSV tips will be in a valley of the roughness and will be exposed more than other TSV tips which may be on a ridge of the roughness. Such variation can degrade the controllability of the process. Also, a high roughness value is generally indicative of a high dislocation density in the backside wafer surface 107 near the background surface which degrades the mechanical strength of the wafer 105 when it is thinner than 300 μm and after it is removed from the carrier.

The depth (d) of the embedded TSV 110 can be measured after TSV etch or after the subsequent barrier and seed deposition into the TSV (in the case of an electroplated metal such as copper) and onto the whole wafer 105 using methods such as interferometry or laser pulse time-of-flight methods. The measured actual values of the TSV depth, the carrier thickness, the adhesive thickness and the targeted value of the protective layer thickness can be added to together to determine the targeted thickness of the bonded wafer and carrier after backgrind.

Alternatively, interferometry can be used for measuring the protective layer thickness ($t_1$) over the TSV tips 112 after backgrind as a feedback method. In this case, a generally safe backgrind amount is calculated based on the targeted TSV depths, carrier thickness and adhesive thickness instead of the actual values. Then backgrind can be performed with a target of this safe total bond wafer and carrier. Then the actual protective layer thickness can then be measured and this value can be used to determine the first backside wafer etch amount necessary to expose the TSV tips.

Figure 1C:
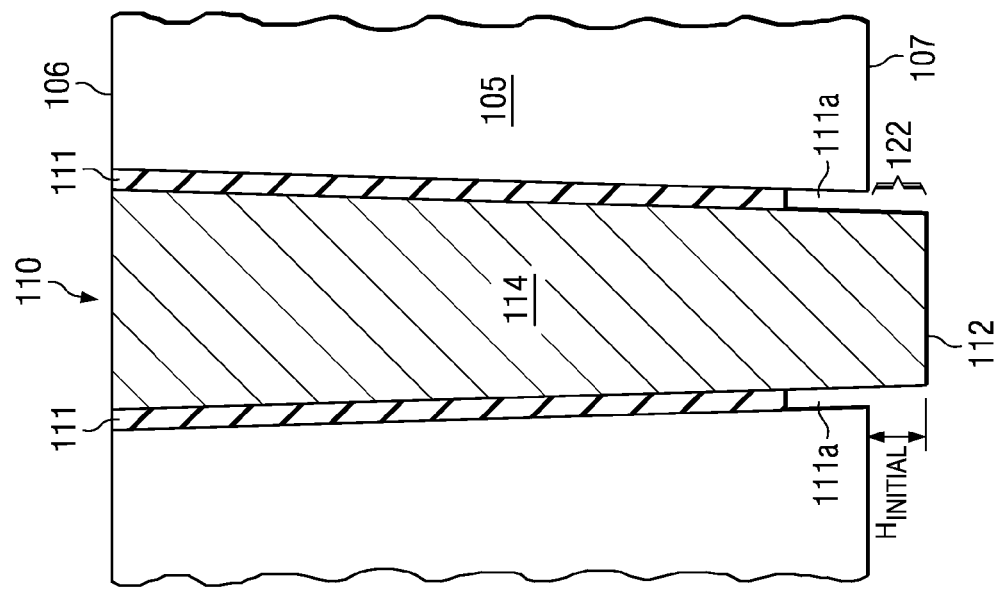
Figure 1D:
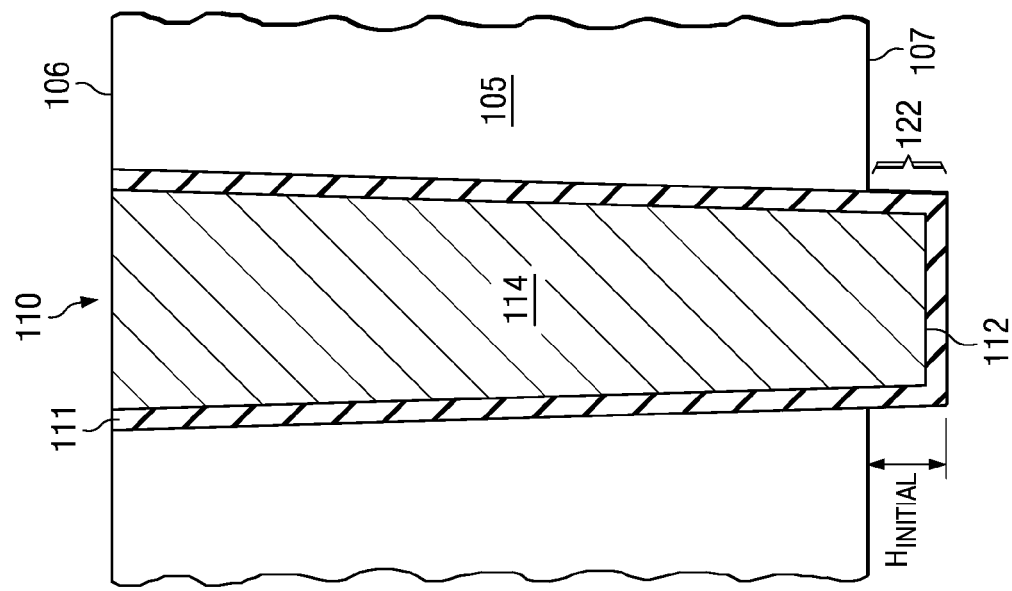
Figure 1E:
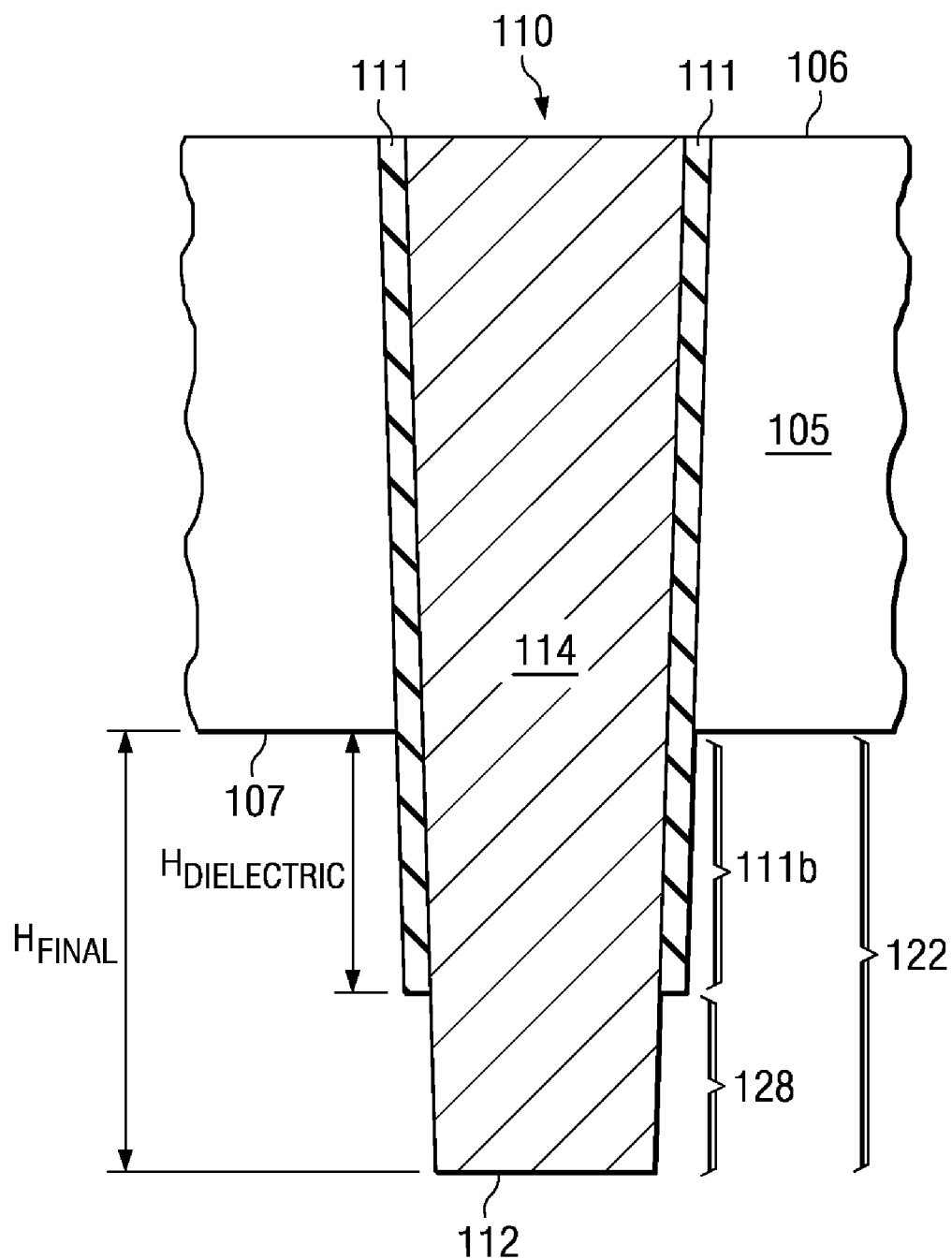

FIGS. 1C-E show cross sectional depictions following respective steps in an exemplary multi-step chemical etch process which as noted above is defined to be exclusive of mechanical etching. The multi-step chemical etch process completes the substrate thinning process by gently (i.e. non-mechanically) removing the protective substrate layer ($t_1$) to form protruding integral TSV tips. As described below, a protruding integral TSV tip generally comprises an electrically conductive filler material 114 and dielectric liner 111 that both protrude from the bottom surface 107 of the substrate 105.

FIG. 1C shows a cross sectional depiction of the structure following a first backside etch to etch the bottom surface 107 of the wafer 105 with selectivity with respect to the dielectric liner 111 to form a protruding integral TSV tip 122 having an initial tip height $H_{initial}$. The etch selectivity for the first backside etch is generally high enough to avoid removing the dielectric liner 111 to expose the electrically conductive filler material 114 of the protruding integral TSV tip 122. The first backside etch generally has a selectivity between the material of the wafer 105 (e.g., silicon) and the dielectric liner 111 of >10:1, and is typically 100:1 to 1,000:1 or more. A selectivity lower than about 10 will generally cause excessive loss of the dielectric liner 111.

The first backside etch process can comprise a variety of wet etch options including quaternary ammonium hydroxides such as ((CH$_3$)$_4$NOH); tetramethyl ammonium hydroxide) commonly referred to as TMAH, KOH, choline, mixtures of acids such as HF, nitric, sulphuric, and phosphoric. Alternatively, a dry etch process, such as a fluorine containing plasma etch, can also generally be used. As another alternative, CMP can be used if it is configured to provide provided a selectivity between the material of the wafer 105 (e.g., silicon) and the dielectric liner 111 of >10:1.

The range of the thickness of the wafer 105 that is removed by the first backside etch is generally <6% within a wafer with average variation of <5% from wafer to wafer. The total substrate amount etched in the first backside etch is generally from 5 to 50 μm.

FIG. 1D shows the resulting cross sectional of the structure following a second backside etch for removing the dielectric liner 111 from at least the distal end of the protruding integral TSV tip 122. This process can comprise a wet etch process such as HF or dilute HF, or a fluorine-based plasma etch. As shown, the dielectric liner 111 may become recessed from the bottom surface 107 of substrate 105 to form a dielectric liner recess 111(*a*) on the periphery of the protruding integral TSV tip 122 because the dielectric liner 111 is generally removed at a significantly higher etch rate as compared to the etch rate of the backside surface 107 of the wafer 105 (e.g., silicon). In other embodiments of the invention, the second backside etch process may be selected to etch the bottom surface 107 of the substrate 105 at a rate relative to that of dielectric liner 111 that is high enough to avoid or at least limit formation of such dielectric recesses 111(*a*).

The second backside etch should generally have a selectivity between etching the dielectric liner 111 and electrically conductive filler material 114 of >2:1, typically being >10:1. Lower selectivity below about 2:1 can cause excessive loss of the electrically conductive filler material 114.

The range of the thickness of the dielectric liner 111 that is removed by the second backside etch should generally be <10% within a wafer with average variation of <10% from wafer to wafer. The total etch amount for dielectric liner 111 is generally from 0.2 to 10 μm.

The second backside etch can also be a sequence of two or more etch conditions to remove the full thickness of the dielectric liner 111 to expose the surface of the electrically conductive filler material 114 for protruding integral TSV tip 122. The exposed surface of the electrically conductive filler material 114 should generally be free of significant corrosion (i.e. oxide). As noted above, the second backside etch can also be selected to remove the barrier metal layer if present on the surface of the electrically conductive filler material 114 for protruding integral TSV tip 122.

FIG. 1E shows the resulting cross sectional structure following a third backside etch to remove substrate material (e.g., silicon) from the bottom surface 107 of substrate 105 to achieve the desired TSV tip height for protruding integral TSV tip 122 is shown as H$_{final}$. H$_{final}$ can generally range from 1 μm to 50 μm, and is typically selected depending on the standoff distance for the particular package design and joint used to bond to the TSVs to a workpiece. The third backside etch process has a selectivity to the electrically conductive filler material 114 and generally also a selectivity to the dielectric liner 111. The resulting height of the dielectric liner 111 of the integral TSV tip 122 referred to herein as the dielectric tip liner 111(*b*) is shown as h$_{dielectric}$. h$_{dielectric}$ generally ranges from 0.1 μm to 50 μm and typically ranges from 10 to 90% of H$_{final}$, such as 3 μm to H$_{final}$ minus 3 μm. H$_{final}$ is seen in FIG. 1E to include exposed tip portion 128 that comprises exposed electrically conductive filler material 114 on the end of protruding integral TSV tip 122. Exposed tip portion 128 thus extends beyond dielectric tip liner 111(*b*).

Analogous the first backside etch, the third backside etch process generally has a selectivity between the material of the wafer 105 (e.g., silicon) and the dielectric liner 111 of >10:1, and is typically 100:1 to 1,000:1 or more, and can comprise a wet etch with various options including TMAH, KOH, choline, mixtures of acids such as HF, nitric, sulphuric, and phosphoric. Alternatively, a dry etch process, such as a fluorine containing plasma etch, can generally be used. As another alternative, CMP can be used if it is configured to provide a selectivity between the material of the wafer 105 (e.g., silicon) and the dielectric liner 111 of >10:1.

The third backside etch generally provides a selectivity between substrate (e.g., silicon) etching and the electrically conductive filler material 114 of the TSV 110 of >2:1, with a typical selectivity of >10:1. Lower selectivity can cause excessive loss of the electrically conductive filler material 114.

The range of the thickness of the wafer 105 that is removed by the third backside etch is generally <6% within a wafer with average variation of <5% from wafer to wafer. The total etch amount is generally between 5 and 50 μm.

The exposed tip portion 128 generally has a range of variation that is approximately ≦30% of the H$_{final}$. The exposed tip portion 128 generally has a low amount of remaining dielectric liner 111 on its surface, such as <1%, and typically no measurable dielectric liner 111 at all. The bottom surface 107 of wafer 105 after the third backside etch last Si etch should generally avoid contamination with metal which can degrade the semiconductor devices in the device region of the wafer 105 such as Cu, Fe, Ni, Au, Ag.

For example, if the electrically conductive filler material 114 comprises copper with a barrier metal, such as Ta, TaN or TiN, to keep the copper from diffusing into the wafer 105, the electrically conductive filler material 114 at the TSV tip and dielectric liner 111 should generally have few if any cracks which would allow the copper to diffuse into the device regions of the Si substrate and result in leaky junctions. This same applies to other metals which cannot generally be tolerated in the device regions of the wafer 105, such as Ni, Au, or Ag. If the exposed electrically conductive filler material 114 oxidizes after exposure to air or collects some organic contamination from the air, such unwanted material can be removed at a later time of package joint formation with a suitable chemical etch, such as a flux or fluxing agent.

Although exposed tip portion 128 is shown in FIG. 1E as being only electrically conductive filler material 114 (e.g., copper or tungsten), the surface of exposed tip portion 128 can also include a surface coating layer, such as a barrier metal such as Ta, TaN or TiN, or a solderable metal such as Au or Pd formed on the electrically conductive filler material 114.

Figure 2:
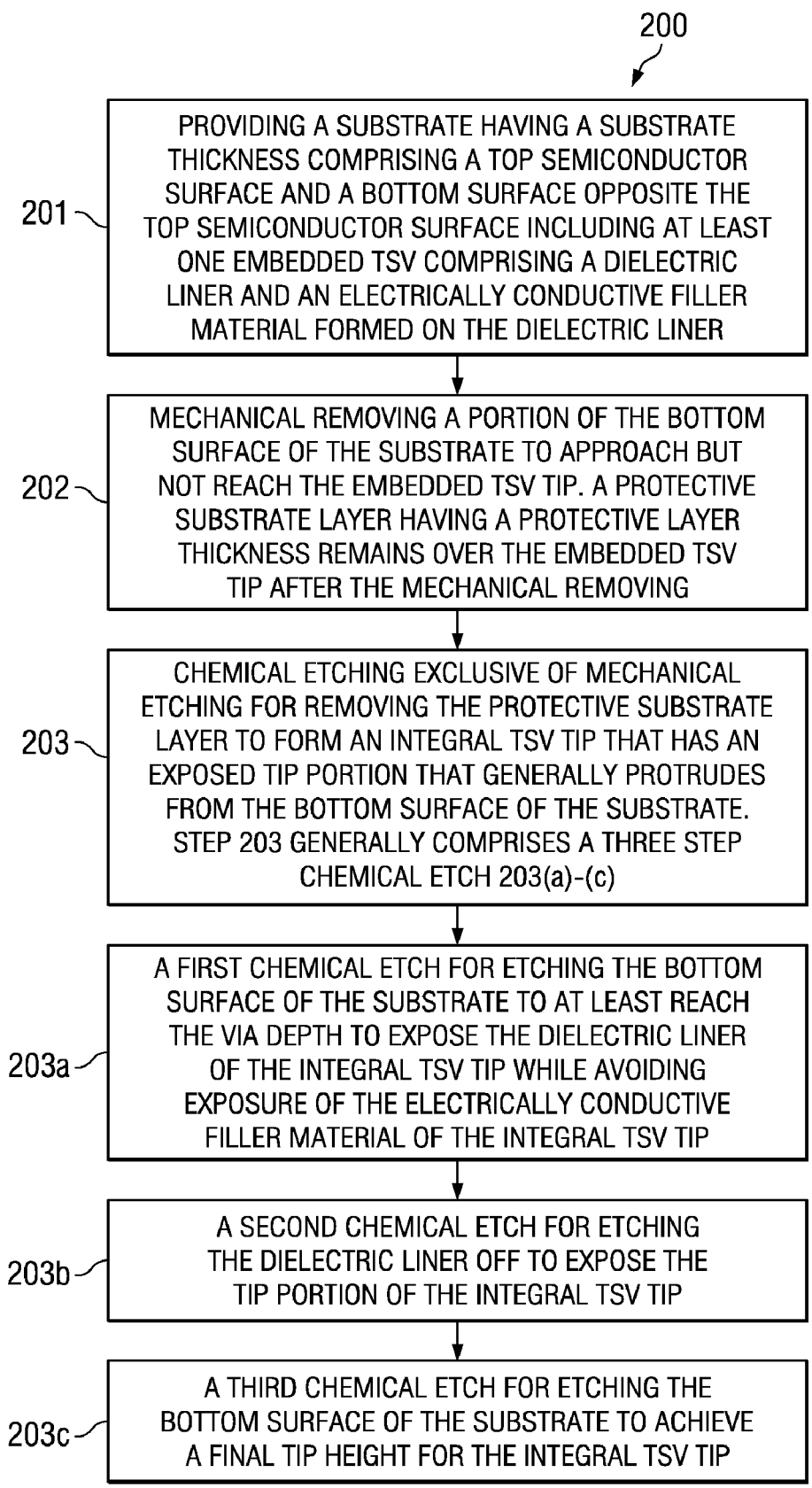
FIG. 2 is a flow chart that shows steps in an exemplary method for fabricating ICs including via-first TSVs, according to an embodiment of the invention.

FIG. 2 is a flow chart that shows steps in an exemplary method 200 for fabricating ICs including via-first TSVs, according to an embodiment of the invention. Step 201 comprises providing a substrate having a substrate thickness comprising a top semiconductor surface and a bottom surface opposite the top semiconductor surface including at least one embedded TSV having an embedded TSV tip in the substrate. The embedded TSV tip extends from the top semiconductor surface to a via depth that is less than the substrate thickness. The embedded TSV includes a dielectric liner and an electrically conductive filler material formed on the dielectric liner.

Step 202 comprises mechanical removing a portion of the bottom surface of the substrate to approach but not reach the embedded TSV tip. A protective substrate layer having a protective layer thickness remains over the embedded TSV tip after the mechanical removing. As described above, the protective layer avoids conventional grinding into the TSV tips which reduces or eliminates damage, cracking and/or scratching the electrically conductive filler material, the dielectric liner and the barrier layer (if present) of the TSV, as well as metal contamination due to smearing of the electrically conductive filler material when such material comprises a metal.

Step 203 comprises chemical etching exclusive of mechanical etching for removing the protective substrate layer to form an integral TSV tip that has an exposed tip portion on the bottom surface of the substrate. In embodiments of the invention, the integral TSV tip comprises a protruding integral TSV tip that protrudes from the bottom surface of the substrate, wherein the protruding integral TSV tip comprises the electrically conductive filler material extending out a tip height from 1 to 50 μm and including a dielectric tip liner on the electrically conductive filler material for at least a portion of the tip height.

Step 203 is generally a three step chemical etch. Step 203(a) can comprise a first chemical etch for etching the substrate on its bottom side surface to at least reach the via depth to expose the dielectric liner on the protruding integral TSV tip while avoiding exposure of the electrically conductive filler material of the integral TSV tip. Step 203(b) can comprise a second chemical etch for etching the dielectric liner off to expose the tip portion of the protruding integral TSV tip. Step 203(c) can comprise a third chemical etch for etching the substrate from said bottom side surface to achieve a final tip height for the protruding integral TSV tip.

As described above, method embodiments of the invention generally include a sequence of chemical etches including a substrate (e.g., silicon) etch followed by a dielectric etch, followed by another substrate (e.g., silicon) to expose the electrically conductive filler material of the TSV, as generally needed in subsequent steps of attaching the TSVs electrically to other electrical components. Such embodiments generally remove the surface region of the backside of the substrate which has mechanical damage from the backgrind, and create enough distance between the electrically conductive filler material exposed at the bottom tips of the TSV and the wafer material to substantially reduce electrical shorts or leakage. A significant advantage using chemical etches for initial TSV tip exposure according to embodiments of the invention is that mechanical damage to the TSV tip is generally avoided. Avoiding contact of the bottom tips of the TSVs by the backgrind tool can avoid damage to the dielectric and the diffusion barrier metal of the TSV. Advantages of embodiments of the invention generally include a better manufacturing margin, and compatibility with metal (e.g., Cu) joints and bonding methods. Embodiments of the invention are generally also lower cost as compared to CMP based methods for forming exposed TSV tips.

Figure 3A:
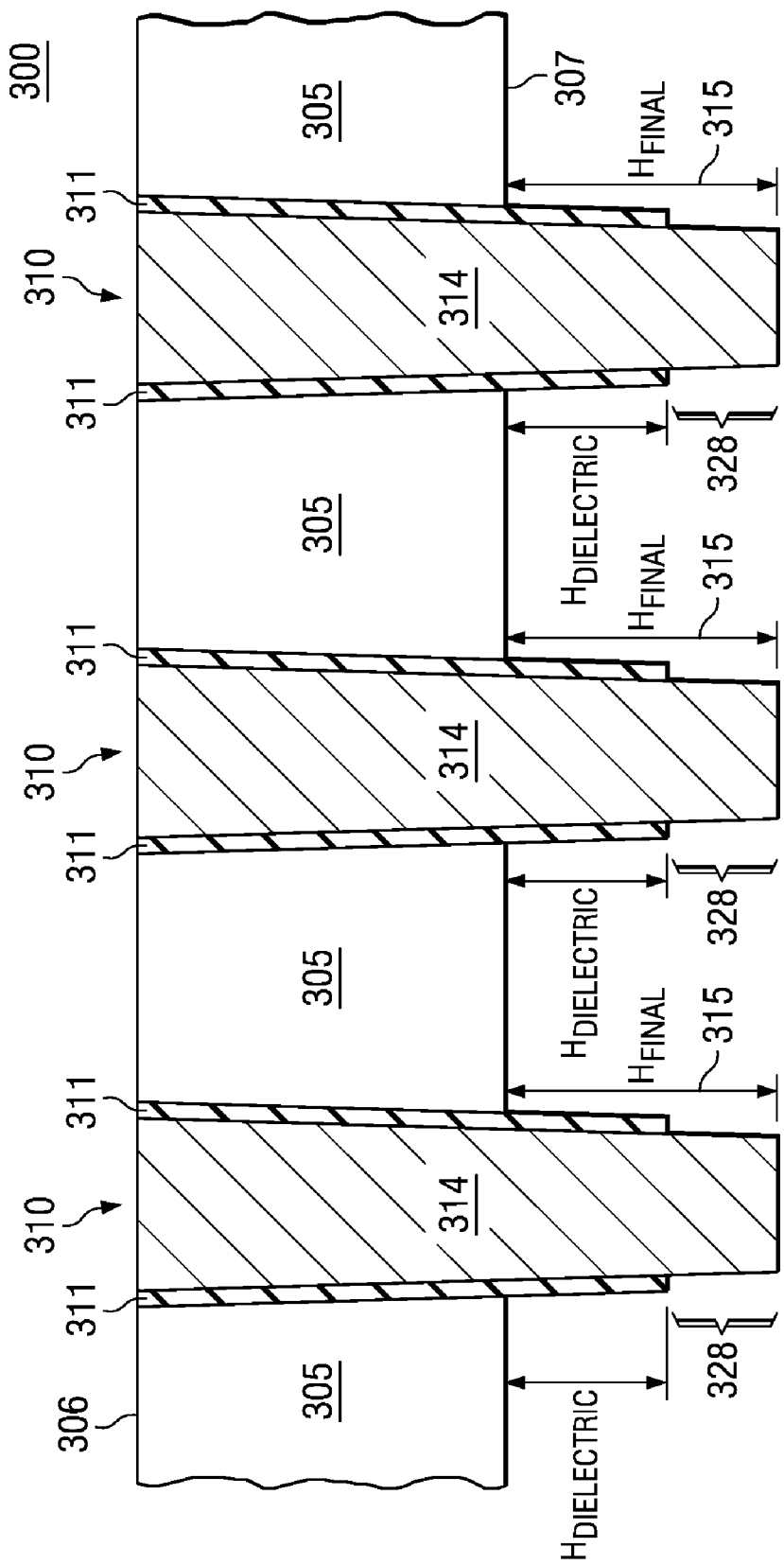
FIG. 3A shows a cross sectional depiction of an IC die having TSVs including protruding integral TSV tips, according to an embodiment of the invention.

FIG. 3A shows a cross sectional depiction of an IC die 300 having TSVs 310 including protruding integral TSV tips 315, according to an embodiment of the invention. IC die 300 includes a substrate 305 having a substrate thickness (typically 75 to 125 μm, but can range between 5 and 200 μm) comprising a top semiconductor surface 306 and a bottom surface 307 opposite the top semiconductor surface. The TSVs 310 include a dielectric liner 311 and an electrically conductive filler material 314 on the dielectric liner 311. The TSVs 310 extend from the top semiconductor surface 306 to an integral TSV tip 315 that protrudes from the bottom surface 307 of the substrate 305. The protruding integral TSV tip 315 comprises the electrically conductive filler material 314 and has a tip height shown as $H_{final}$ that is 1 to 50 μm. A height of said dielectric liner shown as dielectric is 10 to 90% of the tip height which provides an exposed tip portion 328 on a distal end of the protruding integral TSV tip 315. As a result of the use of the protective substrate layer in methods according to embodiments of the invention, the bottom surface 307 of the substrate 305 generally has less than $1 \times 10^{12}$ atoms of the electrically conductive filler material 314.

Figure 3B:
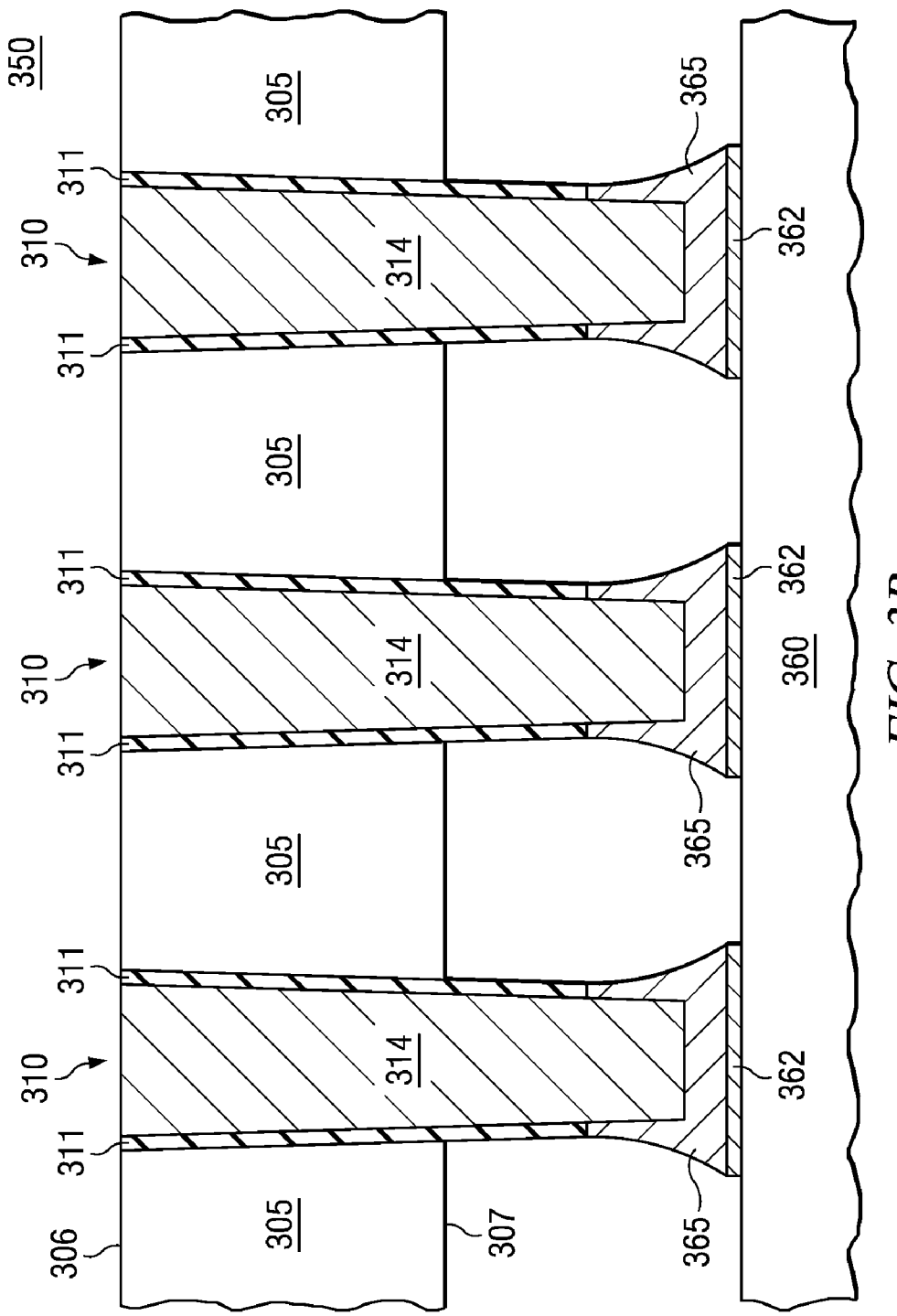
FIG. 3B shows a cross sectional depiction of an electronic assembly comprising the IC die shown in FIG. 3A bonded face up to a workpiece, according to an embodiment of the invention.

FIG. 3B shows a cross section depiction of an electronic assembly 350 comprising the IC die 300 shown in FIG. 3A bonded face up to a workpiece 360, according to an embodiment of the invention. Workpiece 360 can comprise a wafer, another IC die or a package substrate (e.g., printed circuit board (PCB) or lead frame). Workpiece 360 includes a plurality of pads 362, such as copper pads. Solder 365 can be seen to be on the exposed tip portion 328 of TSV tip 315, on pads 362 and the region between the exposed tip portion 328 and pads 362 to provide a solder joint.

EXAMPLES

Embodiments of the present invention are further illustrated by the following specific Examples, which should not be construed as limiting the scope or content of embodiments of the invention in any way.

Bulk silicon wafers were fabricated to include a plurality of embedded TSVs that were approximately 130 μm deep, filled with copper, and lined with a $SiO_2$ liner and a TaN barrier. The TSVs had a diameter from 20 to 30 μm and a pitch of 50 to 70 μm. The wafer thinning and die attach flow is described below. The active circuit face of the wafer was bonded to a reusable Si carrier wafer using an adhesive. Backgrind was used to obtain a wafer thickness of about 137 μm followed by polishing to remove about 2 μm more of the substrate to result in a wafer thickness of 135+/−3 μm. The TSVs thus remained embedded after the backgrinding and polishing processing and the thickness of the protective substrate layer was about 5 μm.

The first backside etch was a silicon etch for etching about 11 μm of silicon with a selectivity to $SiO_2$ of at least 100:1 to expose the protruding integral TSV tips having an initial tip height of about 6 μm. The process used a SEZ wet etcher (Lam Research Corporation, Fremont, Calif.) with TMAH of 2.38% concentration at temperature of 65° C. The second backside etch comprised a fluorine-based plasma etch which removed about 0.6 μm of the $SiO_2$ liner from TSV tips and also removed the TaN barrier over the TSV tips. The third backside etch process used a fluorine-based plasma etch to etch about 24 μm of silicon to achieve 100 μm thick wafers having 30 μm long×25 μm diameter TSV tips. The TSV tips were then cleaned with TMAH to remove any surface oxide.

The height of the protruding integral TSV tips were 30 μm±3.6 μm, and the height ($h_{dielectric}$) of the dielectric sleeve 211 was 23.4 μm±1.9 μm, and the electrically conductive filler material 214 extended about 6.0 μm±3.1 μm beyond the distal end of the dielectric sleeve. The exposed bare Cu tip or other electrically conductive material is generally selected to be small to maximize the height of the dielectric sleeve 211 while maintaining enough bare Cu tip area for subsequent a solder joint formation. Shorter $h_{dielectric}$ and $H_{final}$ is possible and may be particularly useful for die-to-wafer assembly.

The wafer was then transferred from the Si carrier to a tape frame. The wafers were then sawed to form die. The tape protects the TSV tips, but can lead to certain process challenges associated with adhesive residue after pick and place, such as voids between the tape adhesive and the wafer surface with the TSV tips because of the tall height of the TSV tips relative to the adhesive thickness. The die was then picked and placed onto a substrate with copper traces and solder masks where the TSV tips can make a solder joint. Flux was applied to the surface of the substrate prior to placing the die on the substrate. The TSV tips were then placed into the solder mask. Other finishes may be used on the TSV tips, such as Ni/Pd. Monitoring was performed to ensure the plunger did not damage TSV tips. The substrate solder was then reflowed onto the TSV tips, and it was verified that the solder did not flow up on to bottom surface of the silicon substrate. The remainder of the assembly was then completed.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not as a limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for fabricating integrated circuits (ICs) including via-first through substrate vias (TSVs), comprising:

providing a bulk silicon comprising substrate having a substrate thickness comprising a top silicon surface and a bottom silicon surface opposite said top silicon surface including at least one embedded TSV having an embedded TSV tip in said bulk silicon comprising substrate, said embedded TSV tip extending from said top silicon surface to a via depth that is less than said substrate thickness, said embedded TSV including a dielectric liner and an electrically conductive filler material formed on said dielectric liner;

mechanical removing a portion of said substrate from said bottom surface of said substrate to approach but not reach said embedded TSV tip, wherein a protective substrate layer having a protective layer thickness from 2 µm to 10 µm remains over said embedded TSV tip after said mechanical removing; and chemical etching exclusive of mechanical etching for removing said protective substrate layer to form an protruding integral TSV tip that protrudes from said bottom silicon surface, said protruding integral TSV tip comprising said electrically conductive filler material extending out a tip height from 10 to 40 µm and including a dielectric tip liner on said electrically conductive filler material for 10 to 90% of said tip height to provide an exposed tip portion, wherein said chemical etching comprises:

a first chemical etch for etching said silicon on said bottom silicon surface to at least reach said via depth to expose said dielectric liner while avoiding exposing said electrically conductive filler material on said protruding integral TSV tip;

a second chemical etch for etching said dielectric liner off said protruding integral TSV tip to expose said exposed tip portion of said protruding integral TSV tip; and a third chemical etch for etching said silicon from said bottom silicon surface to achieve said tip height for said protruding integral TSV tip.

2. A method for fabricating an integrated circuit device, comprising:

providing a substrate having a fist thickness, a top semiconductor surface, a bottom surface opposite said top semiconductor surface, and an embedded TSV in said substrate including an embedded TSV tip; said embedded TSV extending from said top semiconductor surface to a via depth that is less than said substrate thickness, including dielectric liner and an electrically conductive filler material formed on said dielectric liner;

mechanically removing a portion of said substrate from said bottom surface of said substrate;

stopping the mechanically removing step when the bottom surface is a second thickness from the embedded TSV tip, and chemically etching the bottom surface to expose the TSV tip from the bottom surface, wherein said substrate is a bulk silicon comprising substrate, and said chemical etching comprises:

a first chemical etch for etching said silicon on said bottom surface to at least reach said via depth to expose said dielectric liner;

a second chemical etch for etching said dielectric liner to expose said conductive filler material, and a third chemical etch for etching said silicon from said bottom surface to achieve said tip height for said protruding TSV tip.

3. The method of claim 2, wherein said TSV tip protrudes from said bottom surface of said substrate and includes said electrically conductive filler material extending out a tip height from 1 to 50 µm and includes a dielectric tip liner on said electrically conductive filler material for at least a portion of said tip height.

4. The method of claim 3, wherein said tip height is 10 to 40 µm and a height of said dielectric liner is 10 to 90% of said tip height.

5. The method of claim 2, wherein said second thickness is from 2 µm to 10 µm.

6. The method of claim 2, wherein said second chemical etch is operable for forming a dielectric liner recess.

7. The method of claim 2, wherein an etch selectivity for said first chemical etch between said silicon and said dielectric liner is >100:1, an etch selectivity of said second chemical etch between said dielectric liner and said electrically conductive filler material is >2:1, and an etch selectivity for said third chemical etch between aid silicon and said dielectric liner is >10:1.

8. The method of claim 2, wherein said electrically conductive filler material comprises copper or tungsten and said dielectric liner comprises silicon oxide, silicon nitride, silicon oxynitride or a polyimide.

* * * * *